United States Patent [19]
Cecchi et al.

[11] Patent Number: 5,787,094
[45] Date of Patent: Jul. 28, 1998

[54] TEST AND DIAGNOSTICS FOR A SELF-TIMED PARALLEL INTERFACE

[75] Inventors: Delbert Raymond Cecchi, Rochester; Marius V. Dina, Burnsville; Curtis Walter Preuss; Kenneth Michael Valk, both of Rochester, all of Minn.

[73] Assignee: International Business Machines Corporation, Armonk, N.Y.

[21] Appl. No.: 656,950

[22] Filed: Jun. 6, 1996

[51] Int. Cl.$^6$ ............... G06F 11/10; H03M 13/00
[52] U.S. Cl. ............... 371/53; 371/37.01; 371/37.07; 371/20.5; 395/185.05
[58] Field of Search ............... 371/53, 37.01, 371/37.07, 20.5; 395/185.05, 185.01, 183.22

[56] References Cited

U.S. PATENT DOCUMENTS

| | | | |
|---|---|---|---|
| 3,825,905 | 7/1974 | Allen, Jr. | 395/200.19 |
| 4,710,931 | 12/1987 | Bellay et al. | 371/25 |
| 4,811,345 | 3/1989 | Johnson | 371/20 |
| 5,136,592 | 8/1992 | Weng | 371/39.1 |
| 5,331,274 | 7/1994 | Jarwala et al. | 324/158.1 |
| 5,355,369 | 10/1994 | Greenbergerl et al. | 371/22.3 |
| 5,390,191 | 2/1995 | Shiono et al. | 371/22.3 |
| 5,394,403 | 2/1995 | Klein | 371/21.1 |
| 5,416,409 | 5/1995 | Hunter | 324/158.1 |
| 5,428,714 | 6/1995 | Yawata et al. | 395/112 |
| 5,436,554 | 7/1995 | Decker, Jr. | 324/66 |

FOREIGN PATENT DOCUMENTS

| | | |
|---|---|---|
| 02-020374 | 1/1990 | Japan . |
| 94/18623 | 8/1994 | WIPO . |

OTHER PUBLICATIONS

L. L. Buckel, L. V. Nguyen, P. J. Satz, R. E. Sepulveda and W. Sullivan, "RS/6000 Parallel Port Architectural Verification Loader Program," IBM Technical Disclosure Bulletin, vol. 37, No. 06A, Jun. 1994, pp. 287–289.

*Primary Examiner*—Phung M. Chung
*Attorney, Agent, or Firm*—Merchant, Gould, Smith, Edell, Welter & Schmidt; David W. Lynch

[57] ABSTRACT

A method and apparatus that can test self-timed parallel interfaces operating at system speed. An output stage is provided for queuing a test packet and providing the test packet to an input stage. The packet contains a data bit stream and error detection code such as cyclic redundancy check code. The input stage is coupled to the output stage and receives the test packet to determine the correctness of the data bit stream. On the input stage, the error detection code verifier recalculates the error detection code and compares the recalculated error detection code with the error detection code attached to the data bit stream to determine the correctness of the data bit steam. The output queue has a first input port for receiving data from drivers on the interface and a second input port for receiving a pseudo random data bit stream. A pseudo random data generator generates a pseudo random data bit stream. The data bit stream may be packetized according to a predetermined protocol. An off-chip signal of the output stage may be provided to the inputs of the input stage to produce an on-chip copy of off-chip data.

25 Claims, 4 Drawing Sheets

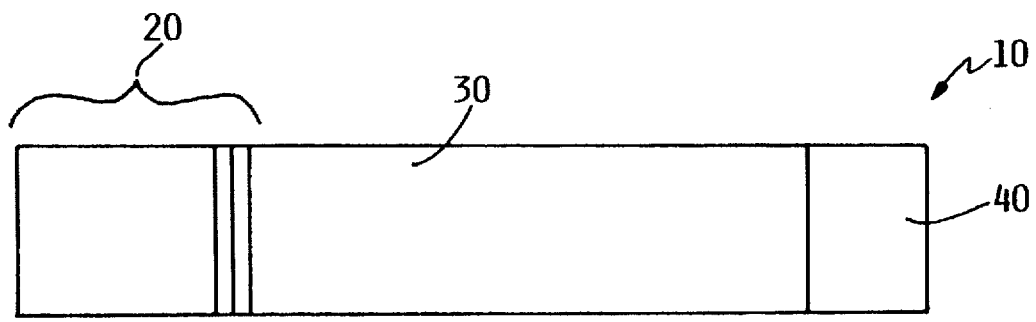
FIGURE IA (PRIOR ART)
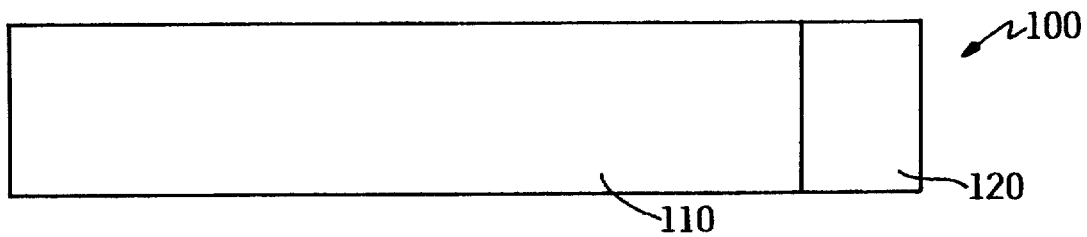
FIGURE IB

TEST AND DIAGNOSTICS FOR A SELF-TIMED PARALLEL INTERFACE

BACKGROUND OF THE INVENTION

1. Field of the Invention.

This invention relates in general to a method and apparatus for testing parallel interfaces, and more particularly, to a method and apparatus having built-in structure for testing a parallel, self-timed interface operating at system speed.

2. Description of Related Art.

Early digital computers embodied a variety of design styles. Though most designs were based on a central timing generator which kept all the functions of the machine in lock-step, there were some examples of asynchronous machines.

For the last two decades asynchronous design has all but disappeared from sight. The clocked approach has led to dramatic progress in the architectures of machines and in the productivity of designers. When all the state in a design changes at the same time, verifying the design becomes a matter of checking the delays in the logic functions between the registers. This is a straightforward process compared with validating an asynchronous circuit, where the design must be examined in very fine detail for critical races and unstable states, then the higher levels checked for liveness and similar properties.

Virtually all digital design today is based on a synchronous approach. The total system is designed as the composition of one or more subsystems where each subsystem is a clocked finite state machine; the subsystem changes from one state to the next on the edges of a regular clock. The state is held in a set of flip-flop registers, and logic is used to derive the new state and outputs from the old state and inputs. The new state is copied through the flip-flops on every rising edge of the clock signal. Special techniques are required whenever a signal crosses into the domain of a particular clock either from outside the system or from the domain of a different clock within the same system. Otherwise the system behaves in a discrete and deterministic way provided a few rules are followed; these rules include managing the delays of the logic so that the flip-flop set up and hold times are met under all conditions.

As computer systems continue to grow in size and complexity, the difficulty in coordinating the activity of the system components also grows. A major cause of this problem lies in the traditional synchronous design style in which all the system components are synchronized to a global clock signal. For example, simply distributing the clock signal throughout a large synchronous system can be a major source of complication. Clock skew is a serious concern in a large system, and is becoming significant even within a single chip. At the chip level, more and more of the power budget is being used to distribute the clock signal, while designing the clock distribution network can take a significant portion of the design time. One solution is to use non-clocked asynchronous techniques.

Accordingly, there is a world-wide resurgence of interest in asynchronous logic design techniques. However, as mentioned above, asynchronous design does not follow the same methodology. In general, with asynchronous designs there is no clock to govern the timing of state changes as there is with synchronous designs. Instead, subsystems exchange information at mutually negotiated times with no external timing regulation.

Self-timed circuits are a subset of a broad class of asynchronous circuits. General asynchronous circuits do not use a global clock for synchronization, but instead rely on the behavior and arrangement of the circuits to keep the signals proceeding in the correct sequence. In general these circuits are very difficult to design and debug without some additional structure to help the designer deal with the complexity.

Traditional clocked synchronous systems are an example of one particular structure applied to circuit design to facilitate design and debugging. Important signals are latched into various registers on a particular edge of a special clock signal. Between clock signals information flows between the latches and must be stable at the input to the latches before the next clock signal. This structure allows the designer to rely on data values being asserted at a particular time in relation to this global clock signal.

Self-timed circuits apply a different type of structure to circuit design. Rather than let signals flow through the circuit whenever they are able as with an unstructured asynchronous circuit, or require that the entire system be synchronized to a single global timing signal as with clocked systems, self-timed circuits avoid clock-related timing problems by enforcing a simple communication protocol between circuit elements. This is quite different from traditional synchronous signaling conventions where signal events occur at specific times and may remain asserted for specific time intervals. In self-timed systems it is important only that the correct sequence of signals be maintained. The timing of these signals is an issue of performance that can be handled separately.

A self-timed paradigm offers several potential advantages beyond the savings in design effort which result from eliminating the global clock distribution circuits. Because of their handshake interfaces, self-timed circuits separate timing from functionality, which leads to an increase in system integration. Systems may be constructed by connecting components and sub-systems based only on their functionality without having to consider their timing requirements. Incremental improvements in speed or functionality are possible by replacing individual subsystems with newer designs without changing or retiming the system as a whole. The systems are robust since subsystems continue to operate over a wide range of process variations, voltage differences, or temperature changes.

Traditionally, processors have communicated with memory, other processors and peripheral devices through a system bus. The system bus works as a broadcast medium where all communication is visible to all nodes. As the bus is shared between more and faster processors, the bus itself soon becomes a bottleneck. A shared bus typically scales to about 10–12 nodes. For larger processor clusters more sophisticated interconnects must be used.

Different solutions to this problem of scalability has been proposed, among these are bus hierarchies and point-to-point connections. For example, one solution to the scalability problem is the Scalable Coherent Interface (SCI), as standardized in ANSI-IEEE Std 1596–1992, herein incorporated by reference. The Scalable Coherent Interface is a point-to-point solution with directory-based cache coherence. The Scalable Coherent Interface provides distributed shared memory to a cluster of nodes, e.g. workstations, memory, disks, high speed network interfaces etc. Hardware-supported shared memory can be used in various applications, ranging from closely synchronized parallel programming to local area network support.

The Scalable Coherent Interface provides the services one expects from a computer bus, but avoids the limitations of buses by using many point-to-point links and a packet protocol. Accordingly, the Scalable Coherent Interface is appropriate for high-performance highly parallel multiprocessors, but also scales down to uniprocessors to get the economic benefits of high volume production. The narrow fast links that carry the Scalable Coherent Interface packets use few pins and have no stub length limits, so a complete Scalable Coherent Interface including drivers, receivers, First-In First-Out (FIFO) buffers and protocol logic fits in one integrated circuit package that may be placed anywhere.

The Scalable Coherent Interface uses unidirectional point-to-point signaling, from one transmitter to one receiver, to simulate a bus without actually using one. This makes the electrical problems much simpler, so speeds can be greatly increased. However, it requires changes to the basic "protocol" that buses use to keep track whether data has been successfully received, whether too much is being sent, whose turn it is to transmit, etc.

The Scalable Coherent Interface does not directly specify what happens to the signals between module connectors. A wide variety of interconnection mechanisms is possible. The inexpensive case is a ring connection, where the output signals from one module are fed to the input signals of the next. The most general case is a switch connection, where the signals from one module are transported by electronic switch mechanisms to the appropriate destination.

Scalable Coherent Interface protocols are designed around packets that carry requests, responses and acknowledgments of various kinds. Many mechanisms can be used to transport these packets. For the standard module and connector described above, the Scalable Coherent Interface specifies 16-bit-wide differential Emitter-Coupled Logic (ECL) signals at a rate of 1000 MBytes per second via 250 MHz square waves. This mechanism is appropriate for short distances in closely-connected multiprocessors, such as a few meters.

In order to use the same protocols in a more widely distributed system, such as a disk farm or clusters of computers and workstations, the Scalable Coherent Interface also specifies a bit-serial transport that can be used with coaxial cable or optical fiber for longer distances, but running slower for practical reasons at 1000 Mbits/s, which is one eighth the throughput of the 16-bit link.

Nevertheless, the use of very high speed self-timed interfaces such as the Scalable Coherent Interface discussed above presents problems at the chip tester and in the system. With typical speeds as high as 500 Mhz, testing is impossible or at best difficult.

It can be seen then that there is a need for a method and apparatus that can test self-timed parallel interfaces operating at system speed.

It can also be seen that there is a need for a method and apparatus that use built-in structure and procedures for testing self-timed parallel interfaces.

SUMMARY OF THE INVENTION

To overcome the limitations in the prior art described above, and to overcome other limitations that will become apparent upon reading and understanding the present specification, the present invention discloses built-in structure for testing and diagnosing a self-timed parallel interface.

The present invention solves the above-described problems by providing a method and apparatus that can test self-timed parallel interfaces operating at system speed.

A system in accordance with the principles of the present invention includes an output stage for queuing a test packet and an input stage, coupled to the output stage, for receiving the test packet and determining the correctness of the data bit stream. The packet contains a data bit stream and error detecting code such as cyclic redundancy check code. Data means provides the packet containing the data bit stream and error detecting codes. Error detector attaches the error detecting code such as cyclic redundancy check code to the data bit stream. On the input stage, the cyclic redundancy check verifier recalculates the cyclic redundancy check code and compares the recalculated cyclic redundancy check code with the cyclic redundancy check code attached to the data bit stream to determine the correctness of the data bit steam.

One aspect of the present invention is that an output queue is provided having a first input port for receiving data from a data source and a second input port for receiving a pseudo random data bit stream.

Another aspect of the present invention is that a pseudo random data generator generates a pseudo random data bit stream.

Another aspect of the present invention is that the data bit stream may be packetized according to a predetermined protocol.

Yet another aspect of the present invention is that an off-chip signal of the output stage may be provided to the inputs of the input stage to produce an on-chip copy of off-chip data.

These and various other advantages and features of novelty which characterize the invention are pointed out with particularity in the claims annexed hereto and form a part hereof. However, for a better understanding of the invention, its advantages, and the objects obtained by its use, reference should be made to the drawings which form a further part hereof, and to accompanying descriptive matter, in which there is illustrated and described specific examples of an apparatus in accordance with the invention.

BRIEF DESCRIPTION OF THE DRAWINGS

Referring now to the drawings in which like reference numbers represent corresponding parts throughout:

FIG. 1a illustrates a typical data packet structure used with self-timed systems such as the Scalable Coherent Interface;

FIG. 1b illustrates a test packet according to the present invention;

DETAILED DESCRIPTION OF THE INVENTION

Figure 2:
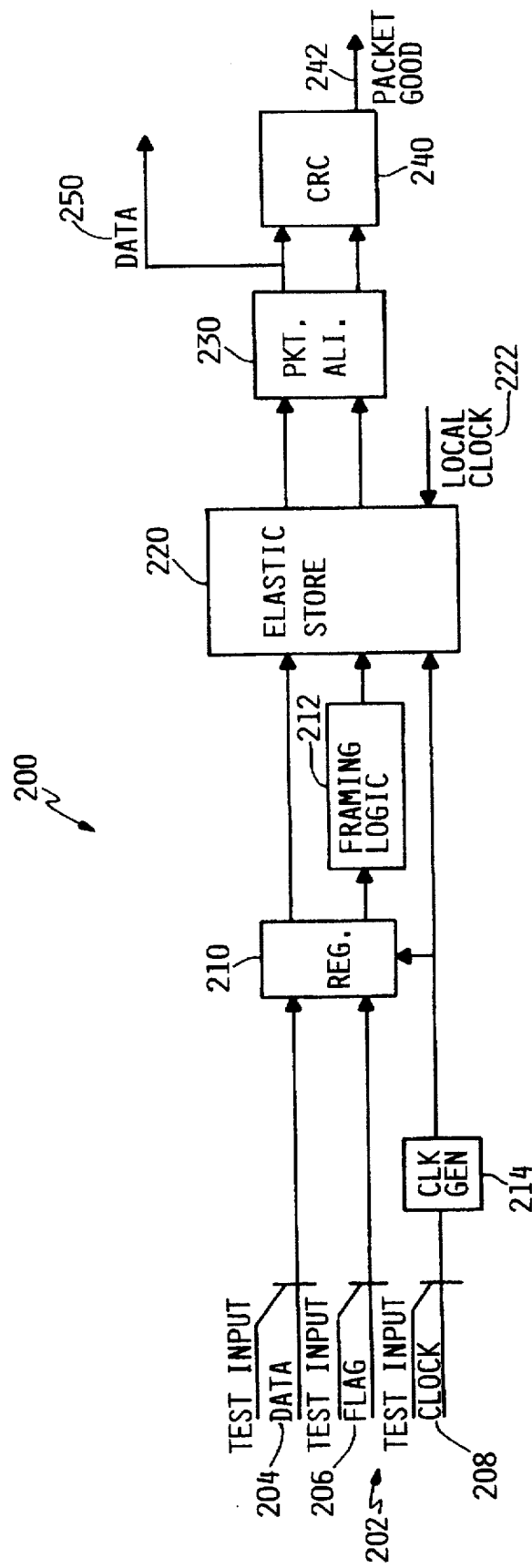
FIG. 2 illustrates an input stage of the test apparatus according to the present invention.

In the following description of the exemplary embodiment, reference is made to the accompanying drawings which form a part hereof, and in which is shown by way of illustration the specific embodiment in which the invention may be practiced. It is to be understood that other embodiments may be utilized as structural changes may be made without departing from the scope of the present invention.

The present invention provides a method and apparatus for testing self-timed parallel interfaces operating at system speed.

FIG. 1a illustrates a typical data packet structure used with self-timed systems such as the Scalable Coherent Interface. The packet protocol specifies the arrangement of information within the packet 10. Typically, the packet 10 includes a header 20 which includes source and destination address, and a command and memory address. The header 20 is normally at the front of the packet 10. Following the header 20 is a data stream 30. Error detecting code such as 32 bit cyclic redundancy check (CRC) 40 may be appended at the end of the packet 10 to provide automatic error detection functionality.

Error detecting code such as cyclic redundancy check (CRC) code 40 is a number derived from a block of data 30 in order to detect corruption. Cyclic redundancy check (CRC) code includes the header 20 and the data 30. Those skilled in the art will recognize that the invention is not meant to be limited to error detection methods which use cyclic redundancy check codes. Error detection may be performed by any known error detection coding methods. Nevertheless, by way of example, the receiver can detect transmission errors by recalculating the cyclic redundancy check code from the data 30 and comparing it to the cyclic redundancy check value 40 originally transmitted.

A cyclic redundancy check 40 is often calculated by summing words or bytes of the data in an N-bit accumulator. Since overflow is usually ignored, the summation is "cyclic" modulo $2^N$. The cyclic redundancy check 40 is "redundant" in that it adds no information. A parity bit can be considered a one-bit cyclic redundancy check 40 for a string of bits. A single corrupted bit in the data will result in a one-bit change in the calculated cyclic redundancy check code 40 but multiple corrupted bits may cancel each other out. Ethernet packets have a 32 bit cyclic redundancy check code. Many disk formats include a cyclic redundancy check at some level.

FIG. 1b illustrates a test packet 100 according to the present invention. The test packet 100 includes a pseudo-random data block 110, usually at the front of the packet, and 32 bit cyclic redundancy check data 120. The pseudo-random data block 110 may be any code and merely provides a random data pattern to perform error checking operations on. Nevertheless, the 32 bit cyclic redundancy heck data 120 may be located anywhere in the packet.

FIG. 2 illustrates the input stage 200 of the test apparatus according to the present invention. External input 202 is received from the interface receivers. The external input 202 includes data 204, and a clock signal 208, and may include a flag 206. The data 204 and flag 206 are input to a register 210 which latches the data up using the clock 208. The flag signal 206 is passed through framing logic 212. The clock 208 is regenerated by a clock generator 214.

The framing logic 212 frames the packet according to a framing specification. The framing specification is a specification of the "protocol bits" that surround the "data bits" on a communications channel to allow the data to be "framed" into chunks, like start and stop bits in RS-232. The framing specification allows a receiver to synchronize at points along the data stream.

An elastic store 220 is provided to receive the data 204, the flag 206, and the clock signal 208 along with a clock local to the chip 222. The elastic store 220 equalizes the clock rates and provides a predetermined packet length output.

The output packets are separated by idles and streamed out by a packet aligner 230. A packet error checker 240 verifies the accuracy of the signal. The packet error checker 240 may be a 32 bit polynomial cyclic redundancy check. The packet error checker 240 provides an output 242 which indicates whether the packet is good or whether errors are present in the data stream. Those skilled in the art will recognize that the cyclic redundancy check verifier 240 need not be placed at the end of the input stage but may be positioned at any location along the data path. The data 250 is tapped off of the stream to the error checker 240.

Figure 3:
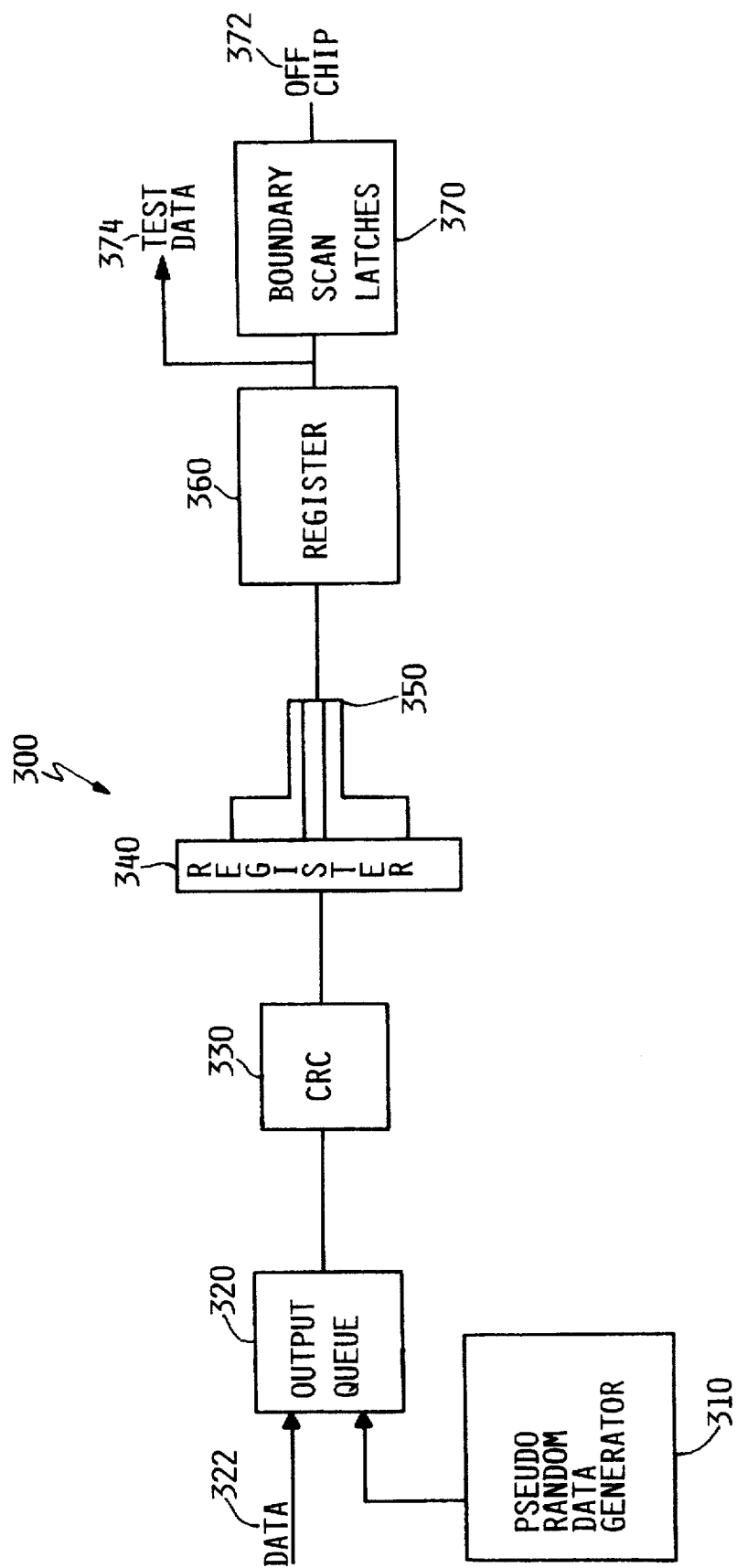
FIG. 3 illustrates an output stage of the test apparatus according to the present invention.

FIG. 3 illustrates the output stage 300 of the test apparatus according to the present invention. Pseudo random data packets are generated by a pseudo random data stream generator 310. The pseudo random data packets may have a length which is pseudo-randomly generated by the pseudo random data stream generator 310. The set of lengths generated will include at least the packet lengths possible when the interface is running in functional mode. Further, the distribution of lengths generated will be approximately the distribution of lengths found when the apparatus according to the invention is running in functional mode.

Pseudo random data packets will normally be generated back-to-back, but there may also be a random-length gap or idle time between packets. Other features which are normally found in the test apparatus in functional mode or which are necessary for the test apparatus to function correctly will be generated by the pseudo random data stream generator 310, such as correctly generating idles between packets and during the time when there is no packet to be sent so that the elastic buffer functions properly. In addition, the pseudo random data stream generator 310 may periodically send synchronization signals to control de-skew logic.

The pseudo random data is input to an output queue 320 along with the data stream 322 from the system (not shown). The output queue controls the output of packets that are passed down stream. The output of the output/queue is provided to a cyclic redundancy check device 330. The cyclic redundancy check device 330 calculates a cyclic redundancy check code and attaches it on the end of the packet so that transmission errors may be identified.

Once the cyclic redundancy check code is attached to the end of the packet, the packet is provided to a register 340. The register 340 controls the output of the stream since the data may be more than one symbol wide. A multiplexor 350 switches between the outputs of the register to combine the signals and provides the packets to a second output stage register 360.

Output from the register 360 is routed to boundary scan latches 370 and then output off-chip 372. Boundary scan involves the use of scan registers to capture state from device input and output pins. The Institute of Electrical and Electronic Engineers (IEEE) Standard 1149.1-1990, incorporated by reference herein, describes the international standard implementation which is sometimes called JTAG after the Joint Test Action Group which began the standardization work. Test data 374 is tapped from the path between the second output stage register 360 and the boundary scan latches 370.

Figure 4:
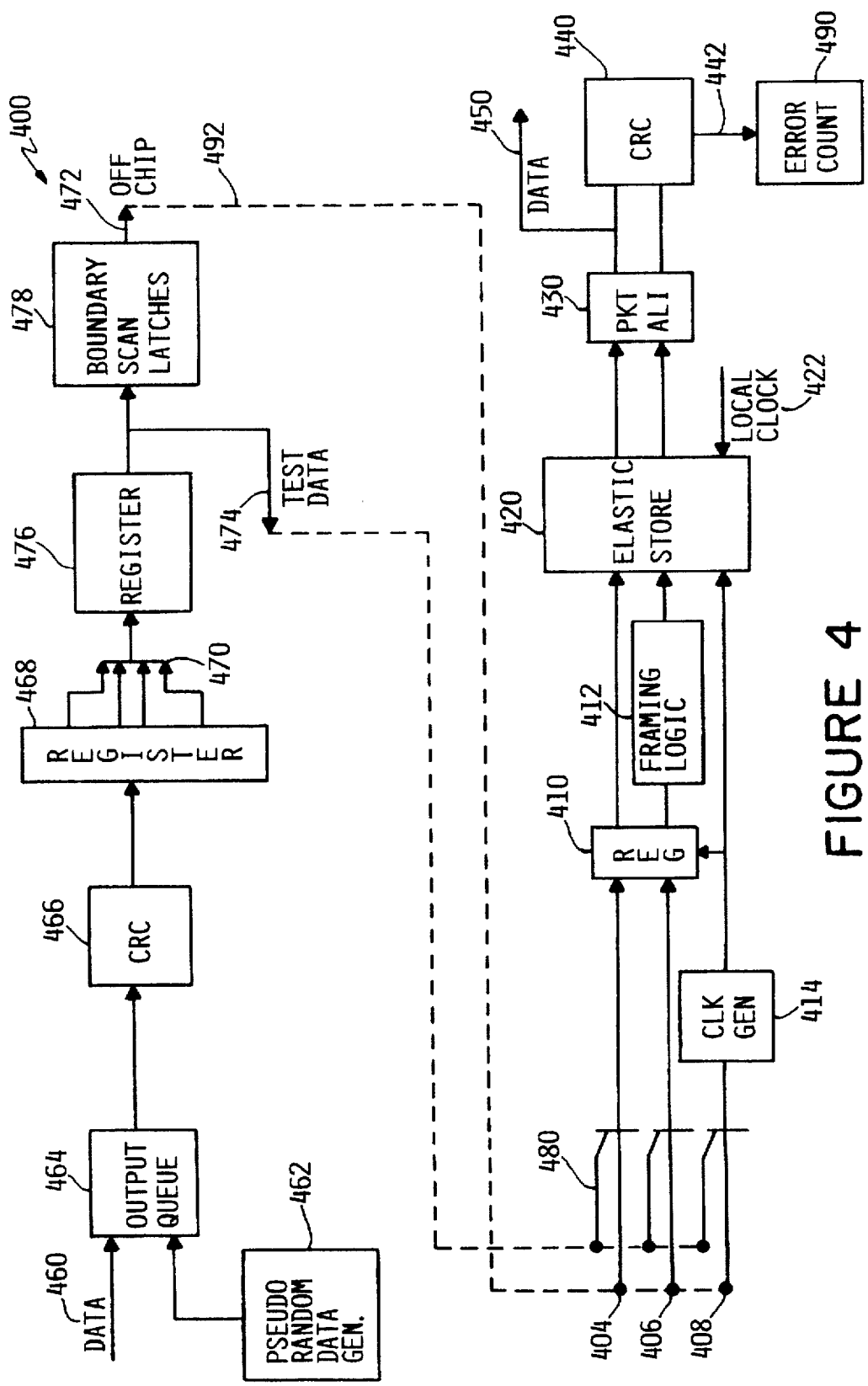
FIG. 4 illustrates a complete test system according to the present invention.

FIG. 4 illustrates a complete test system 400 according to the present invention. The test data 474 is shown routed to the input stage path 480 to provide test data to verify operation of the interface. An error counter 490 is also shown attached to the cyclic redundancy checker 440 at the end of the input stage.

As an option, an off-chip wrap connection 492 may be used as an optional test. There are several ways to get data from the output stage to the input stage. For example, the drivers could be run to the receivers to produce an on-chip copy of the off-chip data to take advantage of JTAG functionality. In this configuration, the off-chip signal 472 is routed to the front of the data input stage. However, this path should be switched out when the test apparatus is not being used to facilitate use of the interface.

Thus, the test system according to the invention generates the test data internally on the fly. Knowledge of the bit pattern of the data is not necessary at the receiving end to test the connections. The cyclic redundancy check code which is transmitted allows the receiving chip to determine the correctness of the data by recalculating the cyclic redundancy check code and comparing the recalculated cyclic redundancy check code to the attached cyclic redundancy check code.

The foregoing description of the exemplary embodiment of the invention has been presented for the purposes of illustration and description. It is not intended to be exhaustive or to limit the invention to the precise form disclosed. Many modifications and variations are possible in light of the above teaching. It is intended that the scope of the invention be limited not with this detailed description, but rather by the claims appended hereto.

What is claimed is:

1. An apparatus for testing a self-timed parallel interface, comprising:
   data means for generating a plurality of data streams for transmission via an output port;
   an error detection code device, coupled to the data means, for calculating and attaching an error detection code to each data steam to form a data packet prior to transmission via the output port;
   a data packet streamer, coupled to the output port, for transmitting data packets back-to-back continuously out the output port; and
   an error detection code verifier for receiving the data packet via an input port, the input port being coupled to the output port, the error detection code verifier recalculating the error detection code and comparing the recalculated error detection code with the error correction code attached to the data bit stream to determine whether the data steam contains an error originating during transmission, wherein the data packet streamer does not resend data streams determined to contain an error.

2. The apparatus of claim 1 further comprises a counter, coupled to the error detection code verifier, for counting the number of received data packets containing an error.

3. The apparatus of claim 1 wherein the error detection code device is a cyclic redundancy check for attaching a cyclic redundancy check code to the data bit stream.

4. The apparatus of claim 1 wherein the error detection code verifier comprises a cyclic redundancy check code verifier.

5. The apparatus of claim 1 wherein the data means is a scanning means for tapping a data packet off of the self-timed parallel interface to provide the data bit stream.

6. The apparatus of claim 1 wherein the data means is a data generator for generating a test packet containing the data bit stream.

7. The apparatus of claim 1 wherein the data means is a data generator for generating a test packet containing the data bit stream.

8. The apparatus of claim 7 wherein the data generator further comprises a pseudo random data generator for generating a pseudo random data bit stream.

9. The apparatus of claim 8 wherein the pseudo random data bit stream comprise a length which is pseudo-randomly generated by the pseudo random data stream generator.

10. The apparatus of claim 7 wherein the pseudo random data bit stream comprises a set of lengths approximately equal to a data bit stream generated when the interface is running in a functional mode.

11. The apparatus of claim 10 wherein the set of lengths for the pseudo random data bit stream generated have a distribution approximately equal to the distribution of lengths generated when the interface is running in the functional mode.

12. The apparatus of claim 1 wherein the data bit stream is packetized according to a predetermined protocol.

13. The apparatus of claim 1 wherein the data bit stream is provided at operating speed.

14. An apparatus for testing a self-timed parallel interface at operating speed, comprising:
   data means for generating a plurality of data streams for transmission via an output port;
   an error detection code device, coupled to the data means, for calculating and attaching an error detection code to each data steam to form a data packet prior to transmission via the output port;
   a data packet streamer, coupled to the output port, for transmitting data packets continuously out the output port separated only by idles; and
   an error detection code verifier for receiving the data packet via an input port, the input port being coupled to the output port, the error detection code verifier recalculating the error detection code and comparing the recalculated error detection code with the error correction code attached to the data bit stream to determine whether the data steam contains an error originating during transmission, wherein the data packet streamer does not resend data streams determined to contain an error.

15. The apparatus of claim 14 wherein the error detection code comprises cyclic redundancy check code.

16. The apparatus of claim 14 wherein the input port receives the data packets and a clock signal.

17. The apparatus of claim 14 further comprising:
   a register, couple to the input port, for latching the data according to the clock signal;
   a framing logic device, coupled to the register, for framing the data bit stream according to a predetermined framing specification; and
   an elastic store register, coupled to the framing logic means, for equalizing clock rates of received packets.

18. The apparatus of claim 14 wherein the data packet streamer comprises a packet aligner for streaming the symbols.

19. The apparatus of claim 14 wherein the data packet further comprises a flag signal.

20. A method of testing a self-timed parallel interface at operating speed, comprising the steps of:
   generating a plurality of data streams for transmission via an output port;
   calculating and attaching an error detection code to each data steam to form a data packet prior to transmission via the output port;
   transmitting data packets back-to-back continuously out the output port;
   receiving the data packet via an input port, the input port being coupled to the output port;

recalculating the error detection code and comparing the recalculated error detection code with the error correction code attached to the data bit stream to determine whether the data steam contains an error originating during transmission; and counting the number of received data packets containing an error.

21. The method of claim 20 wherein the step of calculating and attaching an error detection code further comprises the step of attaching a cyclic redundancy check code to the data bit stream.

22. The method of claim 20 wherein the step of comparing the recalculated error detection code with the error correction code attached to the data bit stream is performed by a cyclic redundancy check code verifier.

23. The method of claim 20 wherein the step of generating a plurality of data streams further comprising the step of tapping a data packet off of the self-timed parallel interface to provide the data bit stream.

24. The method of claim 20 wherein the step of generating the plurality of data bit streams further comprises generating pseudo random bits for the data bit streams.

25. The method of claim 20 wherein the step of generating the plurality of data bit streams further comprises the step of packetizing the data bit streams according to a predetermined protocol.

* * * * *

UNITED STATES PATENT AND TRADEMARK OFFICE
CERTIFICATE OF CORRECTION

PATENT NO. : 5,787,094
DATED : JULY 28, 1998
INVENTOR(S) : CECCHI ET AL.

Page 1 of 2

It is certified that error appears in the above-identified patent and that said Letters Patent is hereby corrected as shown below:

Title page, Abstract, line 12, "steam" should read —stream—.

Column 4, line 14, second occurrence, "steam" should read —stream—.

Column 5, line 1, after "structure" insert —10—.

Column 5, line 43, "heck" should read —check—.

Column 7, line 32, "steam" should read —stream—.

Column 7, line 43, "steam" should read —stream—.

Column 8, line 23, "steam" should read —stream—.

Column 8, line 35, "steam" should read —stream—.

Column 8, line 44, "couple" should read —coupled—.

UNITED STATES PATENT AND TRADEMARK OFFICE
CERTIFICATE OF CORRECTION

PATENT NO. : 5,787,094

DATED : JULY 28, 1998

INVENTOR(S) : CECCHI ET AL.

It is certified that error appears in the above-identified patent and that said Letters Patent is hereby corrected as shown below:

Column 8, line 61, "steam" should read —stream—.

Column 9, line 4, "steam" should read —stream—.

Signed and Sealed this

Twentieth Day of April, 1999

*Attest:*

Q. TODD DICKINSON

*Attesting Officer*     *Acting Commissioner of Patents and Trademarks*